(12) United States Patent
Murakami et al.

(10) Patent No.: US 11,063,004 B2
(45) Date of Patent: Jul. 13, 2021

(54) SEMICONDUCTOR DEVICE, CONTROL DEVICE, AND METHOD FOR MANUFACTURING SEMICONDUCTOR DEVICE

(71) Applicant: Mitsubishi Electric Corporation, Tokyo (JP)

(72) Inventors: Takahiko Murakami, Fukuoka (JP); Arata Iizuka, Tokyo (JP); Ryoji Murai, Fukuoka (JP); Katsuji Ando, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 54 days.

(21) Appl. No.: 16/348,513

(22) PCT Filed: Nov. 29, 2016

(86) PCT No.: PCT/JP2016/085263
§ 371 (c)(1),
(2) Date: May 9, 2019

(87) PCT Pub. No.: WO2018/100600
PCT Pub. Date: Jun. 7, 2018

(65) Prior Publication Data
US 2020/0058600 A1 Feb. 20, 2020

(51) Int. Cl.
*H01L 23/495* (2006.01)
*H01L 23/00* (2006.01)
(Continued)

(52) U.S. Cl.
CPC ........ *H01L 23/562* (2013.01); *H01L 21/4817* (2013.01); *H01L 21/565* (2013.01);
(Continued)

(58) Field of Classification Search
CPC . H01L 23/047; H01L 23/562; H01L 23/3107; H01L 25/072; H02K 11/33
(Continued)

(56) References Cited

U.S. PATENT DOCUMENTS 6,995,461 B2 * 2/2006 Soyano ................... H01L 23/24
257/678
7,723,846 B2 * 5/2010 Ikawa ............... H01L 23/49861
257/732
(Continued)

FOREIGN PATENT DOCUMENTS

| JP | H07-066340 A | 3/1995 |
| JP | H07-153907 A | 6/1995 |

(Continued)

OTHER PUBLICATIONS

International Search Report issued in PCT/JP2016/085263; dated Feb. 21, 2017.
(Continued)

*Primary Examiner* — Nitin Parekh
(74) *Attorney, Agent, or Firm* — Studebaker & Brackett PC

(57) ABSTRACT

An object of the present invention is to provide a semiconductor device capable of reducing external stress transmitted to a semiconductor chip through a lead frame. A semiconductor device includes a base plate, a semiconductor element held on the base plate, a housing disposed on the base plate and having a frame shape enclosing the semiconductor element, a terminal section provided in an outer surface of the housing and connectable to an external device, a lead frame that is long and has one end disposed so as to be connectable to the terminal section provided in the housing and another end connected onto the semiconductor element via a bonding material, a sealing material disposed in the housing to seal the lead frame and the semiconductor (Continued)

element, and a fixing section that fixes, in the housing, part of the lead frame to the base plate or the housing.

23 Claims, 6 Drawing Sheets

(51) Int. Cl.
    *H02K 11/33*     (2016.01)
    *H01L 21/48*     (2006.01)
    *H01L 21/56*     (2006.01)
    *H01L 23/047*     (2006.01)
    *H01L 23/31*     (2006.01)
    *H01L 25/07*     (2006.01)
    *H01L 25/00*     (2006.01)
    *H02K 11/00*     (2016.01)

(52) U.S. Cl.
    CPC ........ *H01L 23/047* (2013.01); *H01L 23/3107* (2013.01); *H01L 25/072* (2013.01); *H01L 25/50* (2013.01); *H02K 11/0094* (2013.01); *H02K 11/33* (2016.01)

(58) Field of Classification Search
    USPC .................................................. 257/666, 723
    See application file for complete search history.

(56) References Cited

U.S. PATENT DOCUMENTS

| | | | | |
|---|---|---|---|---|
| 8,130,499 | B2* | 3/2012 | Ohnishi | H01L 25/162 361/710 |
| 9,076,660 | B2* | 7/2015 | Kim | H01L 23/053 |
| 2001/0002051 | A1 | 5/2001 | Matsumoto | |
| 2007/0114577 | A1 | 5/2007 | Narazaki | |
| 2011/0299265 | A1* | 12/2011 | Nakatsu | H05K 7/209 361/820 |
| 2013/0134775 | A1 | 5/2013 | Tomokage et al. | |
| 2013/0175703 | A1* | 7/2013 | Takaragi | H01L 25/50 257/774 |
| 2014/0001619 | A1* | 1/2014 | Yoo | H01L 23/142 257/676 |
| 2014/0167242 | A1* | 6/2014 | Kim | H01L 23/053 257/690 |
| 2015/0156909 | A1 | 6/2015 | Kwak et al. | |
| 2016/0343641 | A1* | 11/2016 | Hori | H01L 24/11 |

FOREIGN PATENT DOCUMENTS

| | | |
|---|---|---|
| JP | 2007-142138 A | 6/2007 |
| JP | 4985116 B2 | 7/2012 |
| JP | 2013-115958 A | 6/2013 |
| WO | 00/68992 A1 | 7/2000 |

OTHER PUBLICATIONS

An Office Action mailed by the Japanese Patent Office dated Dec. 3, 2019, which corresponds to Japanese Patent Application No. 2018-553515 with English Translation.

* cited by examiner

F I G . 7
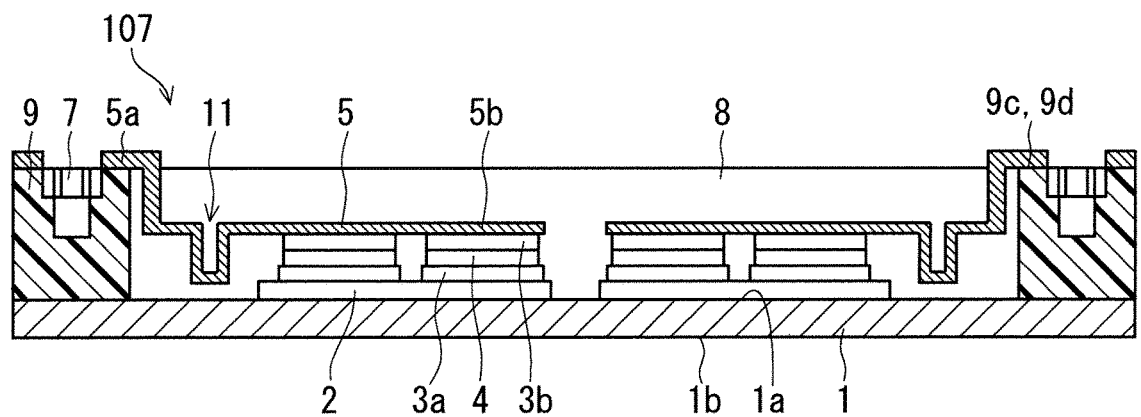
F I G . 8
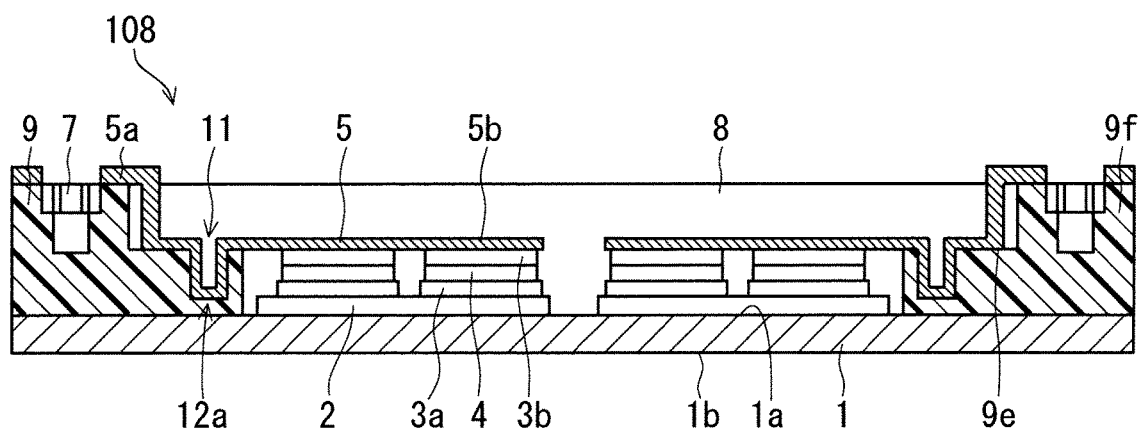

SEMICONDUCTOR DEVICE, CONTROL DEVICE, AND METHOD FOR MANUFACTURING SEMICONDUCTOR DEVICE

TECHNICAL FIELD

The present invention relates to a semiconductor device, a control device, and a method for manufacturing a semiconductor device, and more particularly to a packaging technology.

BACKGROUND ART

Examples of the packaging technology for a semiconductor element include the direct lead bonding in which a semiconductor chip and a plate-shaped lead frame are directly bonded to each other (for example, Patent Document 1). A semiconductor device modularized by the direct lead bonding is smaller in power loss than conventional semiconductor devices.

Patent Document 2 discloses a modularized semiconductor device that results from connecting a bonding wire to a semiconductor chip disposed in a housing and then sealing the housing with resin. A lead frame of such a semiconductor device is not a component integrally molded with the housing made of resin.

PRIOR ART DOCUMENTS

Patent Documents

Patent Document 1: Japanese Patent Application Laid-Open No. 2007-142138
Patent Document 2: Japanese Patent No. 4985116

SUMMARY

Problem to be Solved by the Invention

For a semiconductor device in which the lead frame is not integrally molded with the housing, when the lead frame is bonded to the semiconductor chip by the direct lead bonding, the lead frame is held only at a joint with the semiconductor chip. When external stress is applied to such a semiconductor device, the stress is transmitted to the semiconductor chip through the lead frame. The external stress causes a crack or the like in the semiconductor chip or a bonding layer, and as a result, the reliability of the semiconductor device is deteriorated.

The present invention has been conceived to solve the above problem, and an object of the present invention is to provide a semiconductor device that reduces external stress transmitted to a semiconductor element through a lead frame and improves reliability.

Means to Solve the Problem

A semiconductor device according to the present invention includes a base plate, a semiconductor element held on the base plate, a housing disposed on the base plate and having a frame shape enclosing the semiconductor element, a terminal section provided in an outer surface of the housing and connectable to an external device, a lead frame that is long and has one end disposed so as to be connectable to the terminal section provided in the housing and another end connected onto the semiconductor element via a bonding material, a sealing material disposed in the housing to seal the lead frame and the semiconductor element in the housing, and a fixing section that fixes, in the housing, part of the lead frame to the base plate or the housing.

Effects of the Invention

According to the present invention, it is possible to provide the semiconductor device that reduces external stress transmitted to the semiconductor element through the lead frame and improves reliability.

The object, features, aspects, and advantages of the present invention will become more apparent from the following detailed description and the accompanying drawings.

BRIEF DESCRIPTION OF DRAWINGS

FIG. 7 is a cross-sectional view of a semiconductor device according to a seventh embodiment.
FIG. 8 is a cross-sectional view of a semiconductor device according to an eighth embodiment.

DESCRIPTION OF EMBODIMENTS

Embodiments of a semiconductor device according to the present invention will be described.

First Embodiment

Figure 1:
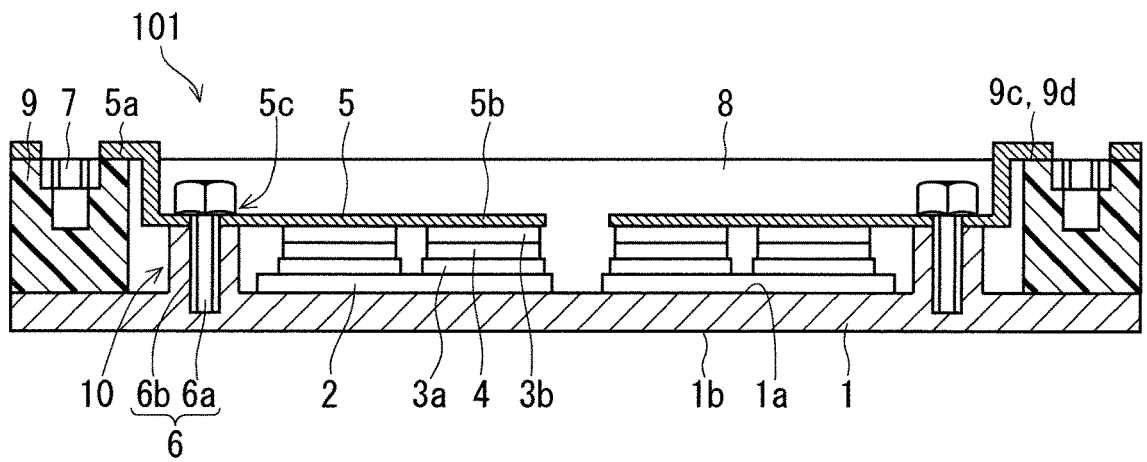
FIG. 1 is a cross-sectional view of a semiconductor device according to a first embodiment.

FIG. 1 is a cross-sectional view of a semiconductor device 101 according to a first embodiment. The semiconductor device 101 includes a base plate 1 and a semiconductor element 4 held on a front surface 1a of the base plate 1 via an insulation layer 2 and a bonding material 3a. In the first embodiment, the base plate 1 is a metal plate that contains, for example, Cu, Al or an alloy containing Cu as a principal component. The base plate 1 is, for example, a heat sink. The insulation layer 2 is, for example, an insulation substrate having a circuit pattern disposed on its front surface, i.e. a printed circuit substrate. The bonding material 3a bonds the insulation layer 2 and the semiconductor element 4 together. The bonding material 3a is, for example, solder. The semiconductor element 4 is, for example, a power semiconductor chip containing SiC or GaN as a principal component. Note that the semiconductor device 101 shown in FIG. 1 includes two insulation layers 2 in a plane of the base plate 1, and two semiconductor elements 4 are arranged on each of the insulation layers 2. The semiconductor device 101 shown in FIG. 1 is an example, and the numbers and arrangements of the insulation layers 2 and the semiconductor elements 4 are not limited to such a configuration.

The semiconductor device 101 further includes a housing 9 having a frame shape in plan view and disposed on the base plate 1 to enclose the semiconductor element 4. An upper surface 9d of the housing 9 is positioned higher than a front surface of the semiconductor element 4. The housing 9 is an insulator made of resin, for example. A terminal section 7 connectable to an external device is disposed on an outer surface 9c of the housing 9. In the first embodiment, the terminal section 7 is disposed on the upper surface 9d of the housing 9. In the first embodiment, the terminal section 7 is a nut capable of fastening wiring connected to the external device in cooperation with a bolt, for example.

The semiconductor device 101 further includes a long or plate-shaped lead frame 5. One end 5a of the lead frame 5 is disposed so as to be connectable to the terminal section 7 of the housing 9. The one end 5a of the lead frame 5 need not necessarily be fixed to the terminal section 7. For example, when the terminal section 7 is a nut, the one end 5a of the lead frame is disposed such that the one end 5a can be fastened to the nut of the terminal section 7 with a bolt together with the wiring connected to the external device. Alternatively, for example, the one end 5a of the lead frame may be disposed in contact with the terminal section 7 in advance. Another end 5b of the lead frame 5 is connected to the front surface of the semiconductor element 4 via a bonding material 3b. In the first embodiment, the semiconductor device 101 includes two lead frames 5, and each of the lead frames 5 is connected to two semiconductor elements 4. As described above, the semiconductor device 101 shown in FIG. 1 is an example, and the number of the lead frames 5 to be installed and the number of the semiconductor elements 4 to be connected to one lead frame 5 are not limited to such numbers. That is, the other end 5b of the lead frame 5 is connected to the front surface of at least one semiconductor element 4.

Further, in the semiconductor device 101, part 5c of the lead frame 5 is fixed in the housing 9, that is, in a space surrounded by the frame shape of the housing 9. The part 5c of the lead frame 5 is positioned between the one end 5a and the other end 5b of the lead frame. The part 5c of the lead frame 5 is fixed by a fixing section 6 of the semiconductor device 101. In the first embodiment, the fixing section 6 is disposed on the base plate 1 inside the housing 9. Further, the fixing section 6 includes a protrusion 10, that is, a boss protruding from the front surface 1a of the base plate 1, a threaded hole 6b provided in the protrusion 10, and a screw 6a screwed into the threaded hole 6b. The protrusion 10 is formed of the same metal as the base plate 1, for example. The part 5c of the lead frame 5 is fixed to the protrusion 10 by the screw 6a that is screwed into the threaded hole 6b. Note that the semiconductor device 101 includes at least one fixing section 6 for each lead frame 5. That is, the semiconductor device 101 may include two or more fixing sections 6 that fix one lead frame 5.

The lead frame 5 is electrically insulated from the protrusion 10 or the base plate 1. The semiconductor device 101 includes an insulation member (not shown) between the fixing section 6 and the part 5c of the lead frame 5 or between the protrusion 10 and the part 5c of the lead frame 5. Examples of the insulation member include a washer made of resin, an insulation film, and the like. Note that the insulation film is formed by, for example, coating on the part 5c of the lead frame 5. Further, for example, a diameter of a hole through which the screw 6a passes, the hole being provided through the part 5c of the lead frame 5, is larger than a diameter of the screw 6a, and the part 5c of the lead frame 5 does not come into contact with the screw 6a. Alternatively, for example, the screw 6a is made of an insulator such as resin, and even when the screw 6a comes into contact with the part 5c of the lead frame 5, the screw 6a is electrically insulated.

In the first embodiment, the part 5c of the lead frame 5 fixed to the protrusion 10 and the other end 5b of the lead frame 5 connected to the semiconductor element 4 have the same height from the front surface 1a of the base plate 1 and are connected in a plane.

The lead frame 5 and the semiconductor element 4 enclosed by the housing 9 are sealed with a sealing material 8. The sealing material 8 is disposed in a container-shaped space defined by the base plate 1 serving as a bottom and the housing 9 serving as side walls.

Further, the lead frame 5 and the housing 9 of the semiconductor device 101 are not integrally, but separately formed. The lead frame 5 and the housing 9 are not integrally molded by insert molding. That is, for example, the lead frame 5 and the housing 9 does not constitute an integrally molded product in which the lead frame 5 is fixed to the housing 9 by the resin making up the housing 9. A method for manufacturing the semiconductor device 101 includes a step of preparing the housing 9 having a frame shape and a step of preparing the lead frame 5 separately from the housing 9. Further, in the first embodiment, the method for manufacturing the semiconductor device 101 includes a step of preparing the base plate 1 in which the fixing section 6 is disposed inside the housing 9. The method for manufacturing the semiconductor device 101 includes a step of preparing the semiconductor element 4 held on the base plate 1, a step of disposing the housing 9 on the base plate 1 to cause the frame shape to enclose the semiconductor element 4, a step of disposing the one end 5a of the lead frame 5 so as to be connectable to the terminal section 7 provided in the outer surface 9c of the housing 9 and bonding the other end 5b of the lead frame 5 onto the semiconductor element 4, a step of fixing the part 5c of the lead frame 5 to the fixing section 6, and a step of injecting the sealing material 8 to seal the lead frame 5 and the semiconductor element 4 in the housing 9.

(Effects)

When external devices (not shown) such as a terminal block, a capacitor, and a motor are connected to the terminal section 7 of the semiconductor device 101, external stress caused by vibration or thermal deformation of such external devices is applied to the lead frame 5. In the semiconductor device 101 of the first embodiment, the external stress input through the lead frame 5 is blocked by the fixing section 6. That is, in the semiconductor device 101, the external stress input to the semiconductor element 4 located closer to a distal end of the lead frame 5 than the fixing section 6 is dampened. The semiconductor device 101 prevents any defect such as a crack from occurring in the semiconductor element 4 or the bonding material 3b due to external stress that is unexpectedly input to the lead frame 5. Accordingly, the semiconductor device 101 avoids any fatal failure occurring in the semiconductor element 4.

In conclusion, the semiconductor device 101 according to the first embodiment includes the base plate 1, the semiconductor element 4 held on the base plate 1, the housing 9 disposed on the base plate 1 and having a frame shape enclosing the semiconductor element 4, the terminal section 7 provided in the outer surface 9c of the housing 9 and connectable to an external device, the lead frame 5 that is long and has the one end 5a disposed so as to be connectable to the terminal section 7 provided in the housing 9 and the other end 5b connected onto the semiconductor element 4 via the bonding material 3b, the sealing material 8 disposed in the housing 9 to seal the lead frame 5 and the semiconductor element 4 in the housing 9, and the fixing section 6 that fixes the part 5c of the lead frame 5 in the housing 9.

In the semiconductor device 101 configured as described above, the external stress input to the lead frame 5 through the terminal section 7 or the one end 5a of the lead frame 5 is blocked by the fixing section 6. In the conventional semiconductor device, the lead frame is fixed only at the joint with the semiconductor element, which causes the external stress to be directly input to the semiconductor element. In the semiconductor device 101 according to the first embodiment, the external stress is attenuated by the fixing section 6. As a result, the external stress transmitted to the semiconductor element 4 is reduced. The semiconductor device 101 prevents any defect such as a crack from occurring in the semiconductor element 4 or the bonding material 3b due to the external stress. Accordingly, the semiconductor device 101 avoids any fatal failure occurring in the semiconductor element 4.

Further, the fixing section 6 of the semiconductor device 101 is disposed on the base plate 1 inside the housing 9. The fixing section 6 includes the threaded hole 6b provided in the protrusion 10 protruding from the front surface 1a of the base plate 1, and the screw 6a. The part 5c of the lead frame 5 is fixed to the protrusion 10 by the screw 6a that is screwed into the threaded hole 6b.

In the first embodiment, the base plate 1 and the protrusion 10 are made of metal. In the semiconductor device 101, the lead frame 5 is held by the protrusion 10 and the base plate 1 that are both rigid. In the semiconductor device 101, even when unexpected external stress is input to the lead frame 5, the fixing section 6 attenuates or blocks the stress. The fixing section 6 prevents the external stress from being transmitted to the semiconductor element 4. The semiconductor device 101 avoids any fatal failure occurring in the semiconductor element 4. Note that when the semiconductor device 101 includes two or more fixing sections 6 for each lead frame 5, the external stress is more largely attenuated or blocked.

Further, the lead frame 5 and the housing 9 of the semiconductor device 101 are not integrally formed. Conventionally, in the semiconductor device including the lead frame and the housing that are not integrally formed, the lead frame is fixed only at a portion where the other end of the lead frame is bonded to the semiconductor element. In the semiconductor device 101 according to the first embodiment, the lead frame 5 that is not integrally formed with the housing 9 is fixed not only at the joint with the semiconductor element 4 but also at the fixing section 6 provided in the protrusion 10. Accordingly, in the semiconductor device 101, the external stress input to the lead frame 5 through the terminal section 7 or the one end 5a of the lead frame 5 is blocked by the fixing section 6. The semiconductor device 101 avoids any fatal failure occurring in the semiconductor element 4.

Further, the part 5c of the lead frame 5 fixed to the fixing section 6 of the semiconductor device 101 and the other end 5b of the lead frame 5 connected to the semiconductor element 4 have the same height from the front surface 1a of the base plate 1 and are connected in a plane. In the semiconductor device 101 configured as described above, the lead frame 5 and the semiconductor element 4 are fixed to each other while maintaining a reliable contact state and blocks stress input from the outside.

The method for manufacturing the semiconductor device 101 according to the first embodiment includes a step of preparing the housing 9 having a frame shape and a step of preparing the lead frame 5 separately from the housing 9. Further, the method for manufacturing the semiconductor device 101 includes a step of preparing the base plate 1 and the semiconductor element 4 held on the base plate 1, a step of disposing the housing 9 on the base plate 1 to cause the frame shape to enclose the semiconductor element 4, a step of disposing the one end 5a of the lead frame 5 so as to be connectable to the terminal section 7 provided in the outer surface 9c of the housing 9 and bonding the other end 5b of the lead frame 5 onto the semiconductor element 4, a step of fixing the part 5c of the lead frame 5 to the fixing section 6, and a step of injecting the sealing material 8 to seal the lead frame 5 and the semiconductor element 4 in the housing 9.

Conventionally, in the semiconductor device including the lead frame and the housing that are not integrally formed, the lead frame is fixed only at a portion where the other end of the lead frame is bonded to the semiconductor element. According to the method for manufacturing the semiconductor device 101 of the first embodiment, in the semiconductor device 101, the lead frame 5 that is not integrally formed with the housing 9 is fixed not only at the joint with the semiconductor element 4 but also at the fixing section 6 provided in the protrusion 10. Accordingly, in the semiconductor device 101, the external stress input to the lead frame 5 through the terminal section 7 or the one end 5a of the lead frame 5 is blocked by the fixing section 6. The semiconductor device 101 avoids any fatal failure occurring in the semiconductor element 4.

Second Embodiment

A semiconductor device according to a second embodiment will be described. Note that descriptions of configurations, operations, and effects identical to those of the first embodiment are omitted.

Figure 2:
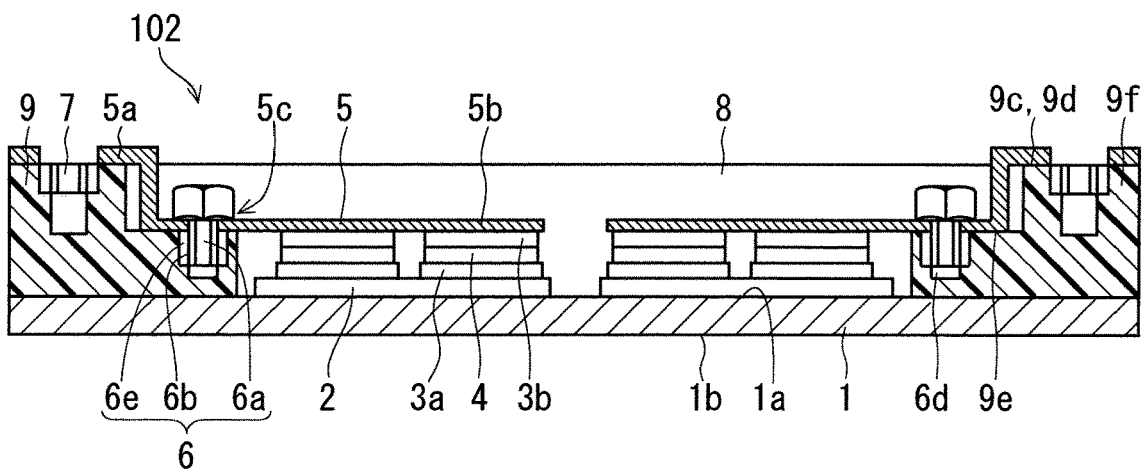
FIG. 2 is a cross-sectional view of a semiconductor device according to a second embodiment.

FIG. 2 is a cross-sectional view of a semiconductor device 102 according to the second embodiment. The semiconductor device 102 includes a fixing section 6 that is different from the fixing section 6 of the semiconductor device 101 described in the first embodiment. A housing 9 includes a housing body 9f having a frame shape and a stepped section 9e that is disposed inside the housing body 9f and is lower in height than the housing body 9f. The fixing section 6 includes a threaded hole 6b and a screw 6a provided in the stepped section 9e.

The threaded hole 6b is a nut that is made of metal and is disposed in a counterbore hole 6d provided through the stepped section 9e made of resin. The nut is, for example, an insert nut 6e (also referred to as a dutch bit or a threaded insert). A part 5c of a lead frame 5 is fixed to the stepped section 9e of the housing 9 by the screw 6a that is screwed into the threaded hole 6b.

Further, the lead frame 5 and the housing 9 of the semiconductor device 102 are not integrally, but separately formed. In other words, a method for manufacturing the semiconductor device 102 includes a step of preparing the housing 9 having a frame shape enclosing a semiconductor element 4, and a step of preparing the lead frame 5 separately from the housing 9. Further, in the second embodiment, the method for manufacturing the semiconductor device 102 includes a step of preparing the housing 9 in which the fixing section 6 is disposed in the stepped section 9e inside the housing body 9f. The method for manufacturing the semiconductor device 102 further includes a step of press-fitting the insert nut 6e into the counterbore hole 6d.

(Effects)

In conclusion, the housing 9 of the semiconductor device 102 according to the second embodiment includes the housing body 9f having a frame shape, the stepped section 9e that is disposed inside the housing body 9f and is lower in height than the housing body 9f. The fixing section 6 is disposed in the stepped section 9e. In the semiconductor device 102, the part 5c of the lead frame 5 is fixed to the stepped section 9e of the housing 9. In the semiconductor device 102 configured as described above, the housing 9 formed separately from the base plate 1 holding the semiconductor element 4 receives and blocks the external stress input to the lead frame 5 through the terminal section 7 or the one end 5a of the lead frame 5. Accordingly, the stress applied to the semiconductor element 4 is further reduced. The semiconductor device 102 prevents any defect such as a crack from occurring in the semiconductor element 4 or the bonding material 3b due to the external stress. Accordingly, the semiconductor device 102 avoids any fatal failure occurring in the semiconductor element 4.

Further, the fixing section 6 of the semiconductor device 102 includes the threaded hole 6b formed in the stepped section 9e and the screw 6a. The part 5c of the lead frame 5 is fixed to the stepped section 9e by the screw 6a that is screwed into the threaded hole 6b. In the semiconductor device 102 configured as described above, the housing 9 formed separately from the base plate 1 holding the semiconductor element 4 receives and blocks the external stress input to the lead frame 5 through the terminal section 7 or the one end 5a of the lead frame 5. Accordingly, the semiconductor device 102 avoids any fatal failure occurring in the semiconductor element 4 due to the external stress.

Further, although not shown, the fixing section 6 of the semiconductor device 102 may further include a washer between the part 5c of the lead frame 5 and a head of the screw 6a. The semiconductor device 102 configured as described above reduces a moment on the lead frame 5 at the time of screwing. Further, the semiconductor device 102 reduces a frictional force at the time of screwing.

Further, the lead frame 5 and the housing 9 of the semiconductor device 102 are not integrally formed. In the semiconductor device in which the lead frame 5 and the housing 9 are not integrally formed and the one end 5a of the lead frame is disposed on the terminal section 7 without being fixed to the terminal section 7, the lead frame 5 is fixed only at a portion where the other end 5b of the lead frame 5 is bonded to the semiconductor element 4. On the other hand, in the semiconductor device 102 according to the second embodiment, the lead frame 5 is also fixed at the fixing section 6 provided in the stepped section 9e. In the semiconductor device 102, the external stress input to the lead frame 5 through the terminal section 7 or the one end 5a of the lead frame 5 is blocked by the fixing section 6. The semiconductor device 102 avoids any fatal failure occurring in the semiconductor element 4.

Third Embodiment

A semiconductor device according to a third embodiment will be described. Note that descriptions of configurations, operations, and effects identical to those of the first embodiment or the second embodiment are omitted.

Figure 3:
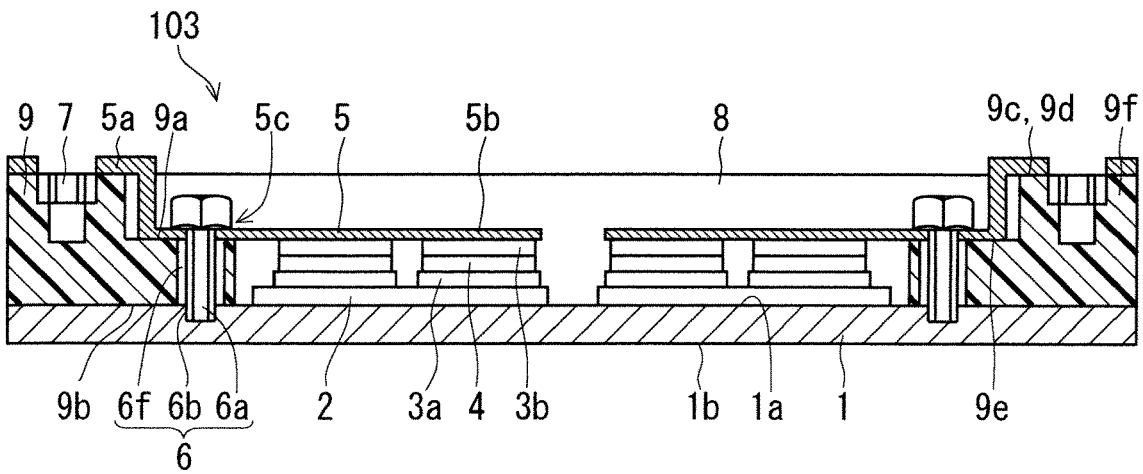
FIG. 3 is a cross-sectional view of a semiconductor device according to a third embodiment.

FIG. 3 is a cross-sectional view of a semiconductor device 103 according to the third embodiment. The semiconductor device 103 includes a fixing section 6 that is different from the fixing section 6 of the semiconductor device 102 described in the second embodiment. A housing 9 of the semiconductor device 103 includes a housing body 9f and a stepped section 9e as in the second embodiment. The stepped section 9e is provided with a through hole 6f passing through from a front surface 9a to a back surface 9b of the stepped section 9e. A threaded hole 6b is formed in a front surface 1a of a base plate 1 in alignment with the through hole 6f opening on the back surface 9b of the stepped section 9e. The fixing section 6 of the semiconductor device 103 includes the through hole 6f provided through the stepped section 9e, the threaded hole 6b, and a screw 6a. A part 5c of a lead frame 5 is fixed by the screw 6a that is screwed into the threaded hole 6b via the through hole 6f. That is, in the semiconductor device 103, the lead frame 5, the housing 9, and the base plate 1 are fixed to each other by the fixing section 6. In addition to the effect described in the first embodiment or the second embodiment, the semiconductor device 103 configured as described above exhibits an effect of easy assembly.

Further, although not shown, the fixing section 6 of the semiconductor device 103 may further include a washer between the part 5c of the lead frame 5 and a head of the screw 6a. The semiconductor device 103 configured as described above reduces a moment on the lead frame 5 at the time of screwing. Further, the semiconductor device 103 reduces a frictional force at the time of screwing.

Fourth Embodiment

A semiconductor device according to a fourth embodiment will be described. Note that descriptions of configurations, operations, and effects identical to those of any one of the first embodiment to the third embodiment are omitted.

Figure 4:
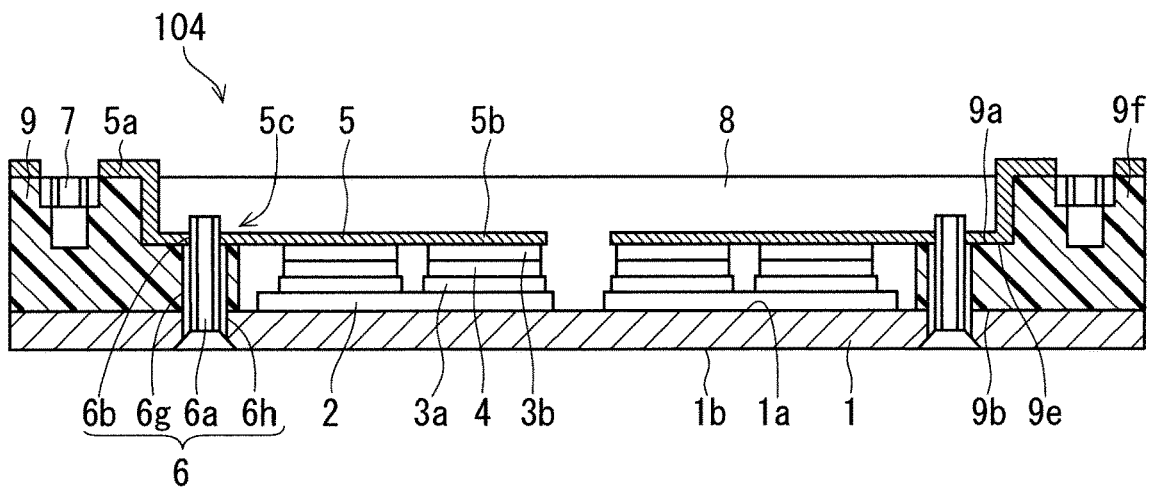
FIG. 4 is a cross-sectional view of a semiconductor device according to a fourth embodiment.

FIG. 4 is a cross-sectional view of a semiconductor device 104 according to the fourth embodiment. The semiconductor device 104 includes a fixing section 6 that is different from the fixing section 6 of the semiconductor device 103 described in the third embodiment. A housing 9 of the semiconductor device 104 includes a housing body 9f and a stepped section 9e as in the third embodiment. The fixing section 6 of the semiconductor device 104 includes a screw 6a, a threaded hole 6b, a first through hole 6g, and a second through hole 6h. The first through hole 6g is provided through the stepped section 9e and passes through from a front surface 9a to a back surface 9b of the stepped section 9e. Further, the second through hole 6h is provided through a base plate 1 and passes through from a front surface 1a to a back surface 1b of the base plate 1 in alignment with the first through hole 6g opening on the back surface 9b of the stepped section 9e. The threaded hole 6b is provided through the part 5c of the lead frame 5 in alignment with the first through hole 6g and the second through hole 6h. The screw 6a has a head disposed on a side of the back surface 1b side of the base plate 1 and is screwed into the threaded hole 6b of the lead frame 5 through the first through hole 6g and the second through hole 6h. As a result, the part 5c of the lead frame 5 is fixed. In the semiconductor device 104 configured as described above, stress in a rotation direction at the time of screwing is not input or is unlikely to be input to a semiconductor element 4. That is, the semiconductor device 104 further reduces the stress applied to the semiconductor element 4 in addition to the effect described in the third embodiment.

Fifth Embodiment

A semiconductor device according to a fifth embodiment will be described. Note that descriptions of configurations, operations, and effects identical to those of the first embodiment are omitted.

Figure 5:
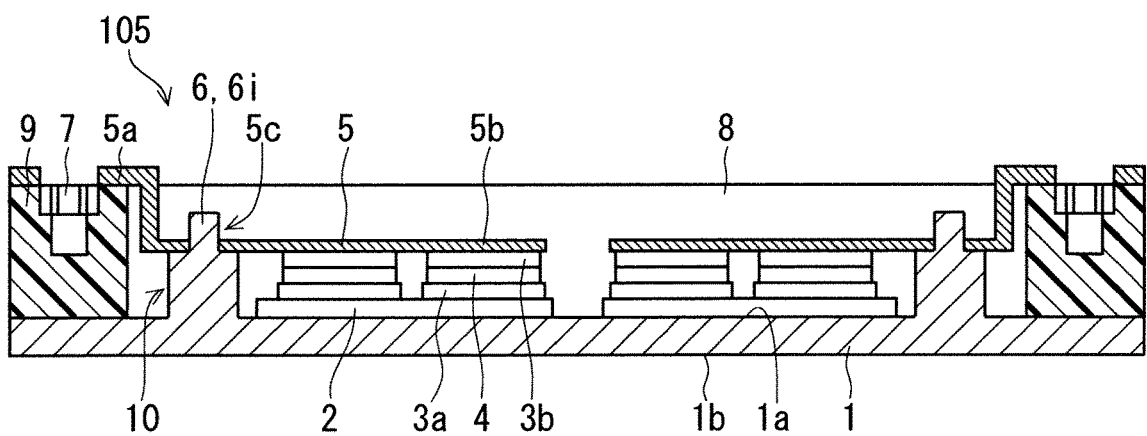
FIG. 5 is a cross-sectional view of a semiconductor device according to a fifth embodiment.

FIG. 5 is a cross-sectional view of a semiconductor device 105 according to the fifth embodiment. A fixing section 6 of the semiconductor device 105 is disposed on a base plate 1 inside a housing 9 as in the semiconductor device 101 described in the first embodiment. A base plate 1 has a protrusion 10, that is, a boss, protruding from a front surface 1a disposed thereon. The fixing section 6 includes a fitting portion 6i provided on the protrusion 10. A part 5c of a lead frame 5 is fitted to the fitting portion 6i and thereby fixed to the protrusion 10. Note that, in a method for manufacturing the semiconductor device 105, the part 5c of the lead frame 5 is press-fitted and fixed to the fitting portion 6i on the protrusion 10. Further, the lead frame 5 is electrically insulated from the protrusion 10 or the base plate 1. The semiconductor device 105 includes an insulation member (not shown) between the fixing section 6 and the part 5c of the lead frame 5 or between the protrusion 10 and the part 5c of the lead frame 5.

In the semiconductor device 105 configured as described above, external stress input to the lead frame 5 through the terminal section 7 or the one end 5a of the lead frame 5 is blocked by the fixing section 6. The external stress is attenuated by the fixing section 6, thereby reducing the external stress transmitted to a semiconductor element 4. The semiconductor device 105 prevents any defect such as a crack from occurring in the semiconductor element 4 or a bonding material 3b due to the external stress. Accordingly, the semiconductor device 105 avoids any fatal failure occurring in the semiconductor element 4. Furthermore, the semiconductor device 105 does not require any new member for providing the fixing section 6, thereby allowing cost reduction.

Sixth Embodiment

A semiconductor device according to a sixth embodiment will be described. Note that descriptions of configurations, operations, and effects identical to those of any one of the second embodiment to the fifth embodiment are omitted.

Figure 6:
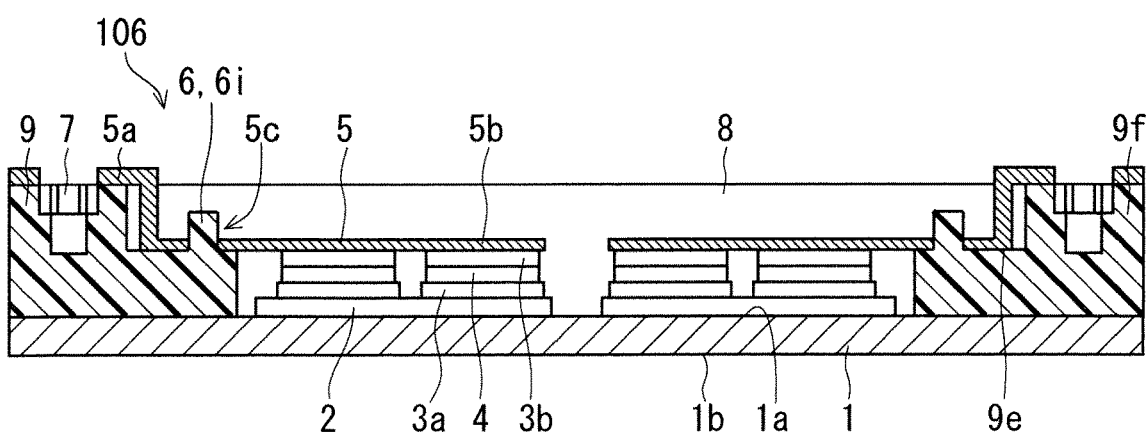
FIG. 6 is a cross-sectional view of a semiconductor device according to a sixth embodiment.

FIG. 6 is a cross-sectional view of a semiconductor device 106 according to the sixth embodiment. The semiconductor device 106 includes a fixing section 6 that is different from the fixing section 6 of the semiconductor device 105 described in the fifth embodiment. A housing 9 of the semiconductor device 106 includes a housing body 9f having a frame shape and a stepped section 9e that is disposed inside the housing body 9f and is lower in height than the housing body 9f. The fixing section 6 includes a fitting portion 6i provided in the stepped section 9e. A part 5c of a lead frame 5 is fitted to the fitting portion 6i and thereby fixed to the stepped section 9e. Note that, in a method for manufacturing the semiconductor device 106, the part 5c of the lead frame 5 is press-fitted and fixed to the fitting portion 6i on the protrusion 10.

In the semiconductor device 106 configured as described above, the housing 9 formed separately from a base plate 1 holding a semiconductor element 4 receives and blocks external stress input to the lead frame 5 through a terminal section 7 or one end 5a of the lead frame 5. The semiconductor device 106 prevents any defect such as a crack from occurring in the semiconductor element 4 or a bonding material 3b due to the external stress. Accordingly, the semiconductor device 106 avoids any fatal failure occurring in the semiconductor element 4. Furthermore, the semiconductor device 106 does not require any new member for providing the fixing section 6, which results in cost reduction.

Seventh Embodiment

A semiconductor device according to a seventh embodiment will be described. FIG. 7 is a cross-sectional view of a semiconductor device 107 according to the seventh embodiment.

The configuration of the semiconductor device 107 is the same as the configuration of the semiconductor device 101 except for the fixing section 6 of the semiconductor device 101 described in first embodiment. That is, the semiconductor device 107 includes a base plate 1 and a semiconductor element 4 held on a front surface 1a of the base plate 1 via an insulation layer 2 and a bonding material 3a. The base plate 1 is a metal plate in the seventh embodiment. The semiconductor device 107 further includes a housing 9 having a frame shape and disposed on the base plate 1 to enclose the semiconductor element 4. The housing 9 is made of, for example, resin. A terminal section 7 connectable to an external device is disposed on an outer surface 9c of the housing 9. In the seventh embodiment, the terminal section 7 is disposed on an upper surface 9d of the housing 9. In the seventh embodiment, the terminal section 7 is a nut capable of fastening wiring connected to the external device in cooperation with a bolt, for example.

The semiconductor device 107 further includes a long or plate-shaped lead frame 5. One end 5a of the lead frame is disposed so as to be connectable to the terminal section 7 of the housing 9. The one end 5a of the lead frame 5 need not necessarily be fixed to the terminal section 7. For example, when the terminal section 7 is a nut, the one end 5a of the lead frame is disposed such that the one end 5a can be fastened to the nut of the terminal section 7 with a bolt together with the wiring connected to the external device. The other end 5b of the lead frame 5 is connected to a front electrode formed on a front surface of the semiconductor element 4 via a bonding material 3b.

The semiconductor device 107 includes a bent section 11 that is part of the lead frame 5 bent into a concave shape inside the housing 9, instead of the fixing section 6 of the semiconductor device 101 described in first embodiment. As shown in FIG. 7, the lead frame 5 includes the bent section 11 between the housing 9 and the semiconductor element 4. That is, the bent section 11 is positioned between the one end 5a and the other end 5b of the lead frame. The bent section 11 has a C-shape, extending toward the base plate 1, that is, extending downward, that is, a U-shape. Note that the shape of the bent section 11 shown in FIG. 7 is an example and is not limited to the shape. Hereinafter, although not shown, for example, the bent section 11 may be formed into an inverted triangle whose vertex is directed toward the base plate 1. Alternatively, for example, the bent section 11 may be formed into a convex shape, that is, a shape bent upward. Still alternatively, for example, the semiconductor device 107 may include, instead of the bent section 11, a curved section that is part of the lead frame 5 curved into a convex shape or a concave shape. That is, the curved section has a convex or concave arc shape.

Further, the lead frame 5 and the semiconductor element 4 enclosed in the housing 9 are sealed by a sealing material 8. The sealing material 8 is disposed in a concave container-shaped space formed by the base plate 1 serving as a bottom and the housing 9 serving as side walls.

Further, the lead frame 5 and the housing 9 of the semiconductor device 107 are not integrally, but separately formed. The lead frame 5 and the housing 9 are not integrally molded by insert molding. That is, for example, the lead frame 5 and the housing 9 does not constitute an integrally molded product in which the lead frame 5 is fixed to the housing 9 by the resin making up the housing 9. A method for manufacturing the semiconductor device 107 includes a step of preparing the housing 9 having a frame shape and a step of preparing the lead frame 5 including the bent section 11 that is part of the lead frame 5 bent into a concave shape separately from the housing 9. The method for manufacturing the semiconductor device 107 includes a step of preparing the semiconductor element 4 held on the base plate 1, a step of disposing the housing 9 on the base plate 1 to cause the frame shape to enclose the semiconductor element 4, a step of disposing the one end 5a of the lead frame 5 so as to be connectable to the terminal section 7 provided in the outer surface 9c of the housing 9 and bonding the other end 5b of the lead frame 5 onto the semiconductor element 4, and a step of injecting the sealing material 8 to seal the lead frame 5 and the semiconductor element 4 in the housing 9.

(Effects)

In conclusion, the semiconductor device 107 according to the seventh embodiment includes the base plate 1, the semiconductor element 4 held on the base plate 1, the housing 9 disposed on the base plate 1 and having a frame shape enclosing the semiconductor element 4, the terminal section 7 provided in the outer surface 9c of the housing 9 and connectable to an external device, the lead frame 5 that is long and has the one end 5a disposed so as to be connectable to the terminal section 7 provided in the housing 9 and the other end 5b connected onto the semiconductor element 4 via the bonding material 3b, and the sealing material 8 disposed in the housing 9 to seal the lead frame 5 and the semiconductor element 4 in the housing 9. The lead frame 5 includes the bent section 11 that is part of the lead frame 5 bent into a concave shape in the housing 9.

In the semiconductor device 107 configured as described above, external stress input through the terminal section 7 or the one end 5a of the lead frame 5 is absorbed by the bent section 11 that is less rigid than surroundings. As a result, the stress applied to the semiconductor element 4 through the lead frame 5 is reduced. The semiconductor device 107 avoids any fatal failure occurring in the semiconductor element 4.

Further, the lead frame 5 and the housing 9 of the semiconductor device 107 are not integrally formed. Conventionally, in the semiconductor device including the lead frame and the housing that are not integrally formed, the lead frame is fixed only at a portion where the other end of the lead frame is bonded to the semiconductor element. In the semiconductor device 107 of the seventh embodiment, the external stress input through the terminal section 7 or the one end 5a of the lead frame 5 is absorbed by the bent section 11 that is less rigid than the surroundings. As a result, the stress applied to the semiconductor element 4 through the lead frame 5 is reduced. The semiconductor device 107 avoids any fatal failure occurring in the semiconductor element 4.

Further, the method for manufacturing the semiconductor device 107 according to the seventh embodiment includes a step of preparing the housing 9 having a frame shape, and a step of preparing the lead frame 5 including the bent section 11 that is part of the lead frame 5 bent into a concave shape separately from the housing 9. The method for manufacturing the semiconductor device 107 includes a step of preparing the semiconductor element 4 held on the base plate 1, a step of disposing the housing 9 on the base plate 1 to cause the frame shape to enclose the semiconductor element 4, a step of disposing the one end 5a of the lead frame 5 so as to be connectable to the terminal section 7 provided in the outer surface 9c of the housing 9 and bonding the other end 5b of the lead frame 5 onto the semiconductor element 4, and a step of injecting the sealing material 8 to seal the lead frame 5 and the semiconductor element 4 in the housing 9.

Conventionally, in the semiconductor device including the lead frame and the housing that are not integrally formed, the lead frame is fixed only at a portion where the other end of the lead frame is bonded to the semiconductor element. According to the method for manufacturing the semiconductor device 107 of the seventh embodiment, in the semiconductor device 107, the external stress input through the terminal section 7 or the one end 5a of the lead frame 5 is absorbed by the bent section 11 that is less rigid than the surroundings. As a result, the stress applied to the semiconductor element 4 through the lead frame 5 is reduced. The semiconductor device 107 avoids any fatal failure occurring in the semiconductor element 4.

Eighth Embodiment

A semiconductor device according to an eighth embodiment will be described. Note that descriptions of configurations, operations, and effects identical to those of the seventh embodiment are omitted.

FIG. 8 is a cross-sectional view of a semiconductor device 108 according to the eighth embodiment. A housing 9 of the semiconductor device 108 includes a housing body 9f having a frame shape and a stepped section 9e that is disposed inside the housing body 9f and is lower in height than the housing body 9f. The stepped section 9e is provided with a groove section 12a. At least part of a bent section 11 of a lead frame 5 is fixed in contact with an inner wall of the groove section 12a of the housing 9. A method for manufacturing the semiconductor device 108 includes a step of inserting the bent section 11 into the groove section 12a.

In the semiconductor device 108 configured as described above, external stress input through the terminal section 7 or the one end 5a of the lead frame 5 is shared by the bent section 11 of the lead frame 5 and the housing 9. In addition to the effect described in the seventh embodiment, the semiconductor device 108 further reduces the external stress applied to the semiconductor element 4.

Ninth Embodiment

A semiconductor device according to a ninth embodiment will be described. Note that descriptions of configurations, operations, and effects identical to those of the seventh embodiment or the eighth embodiment are omitted.

Figure 9:
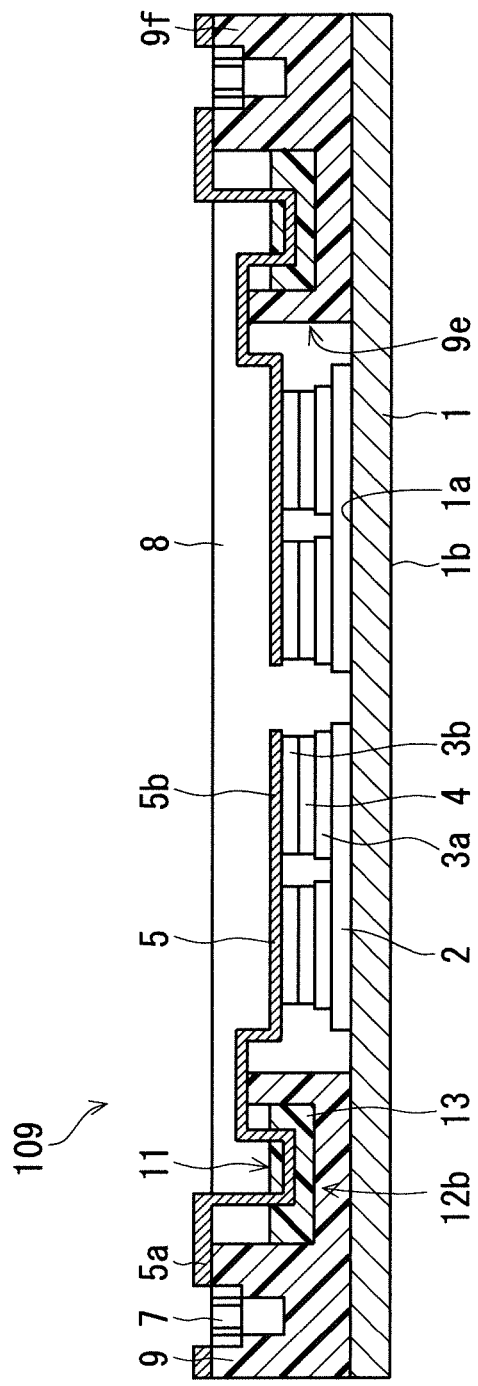
FIG. 9 is a cross-sectional view of a semiconductor device according to a ninth embodiment.

FIG. 9 is a cross-sectional view of a semiconductor device 109 according to the ninth embodiment. A housing 9 of the semiconductor device 109 includes a housing body 9f and a stepped section 9e as in the eighth embodiment. The stepped section 9e is provided with a recessed section 12b. At least part of the bent section 11 of the lead frame 5 is disposed in the recessed section 12b. Furthermore, a fixing material 13 that fixes the bent section 11 is disposed in the recessed section 12b. Note that the recessed section 12b may be the groove section 12a of the semiconductor device 108 described in the eighth embodiment. The fixing material 13 is, for example, resin. Further, a method for manufacturing the semiconductor device 109 includes a step of sealing the lead frame 5 in the recessed section 12b with the fixing material 13 after the lead frame 5 is bonded to the semiconductor element 4. When the fixing material 13 is resin, the recessed section 12b is sealed with the resin.

In the semiconductor device 109 configured as described above, external stress input to the lead frame 5 through the terminal section 7 or the one end 5a of the lead frame 5 is received by the fixing material 13 of the recessed section 12b. The semiconductor device 109 further reduces the external stress applied to the semiconductor element 4.

Tenth Embodiment

Figure 10:
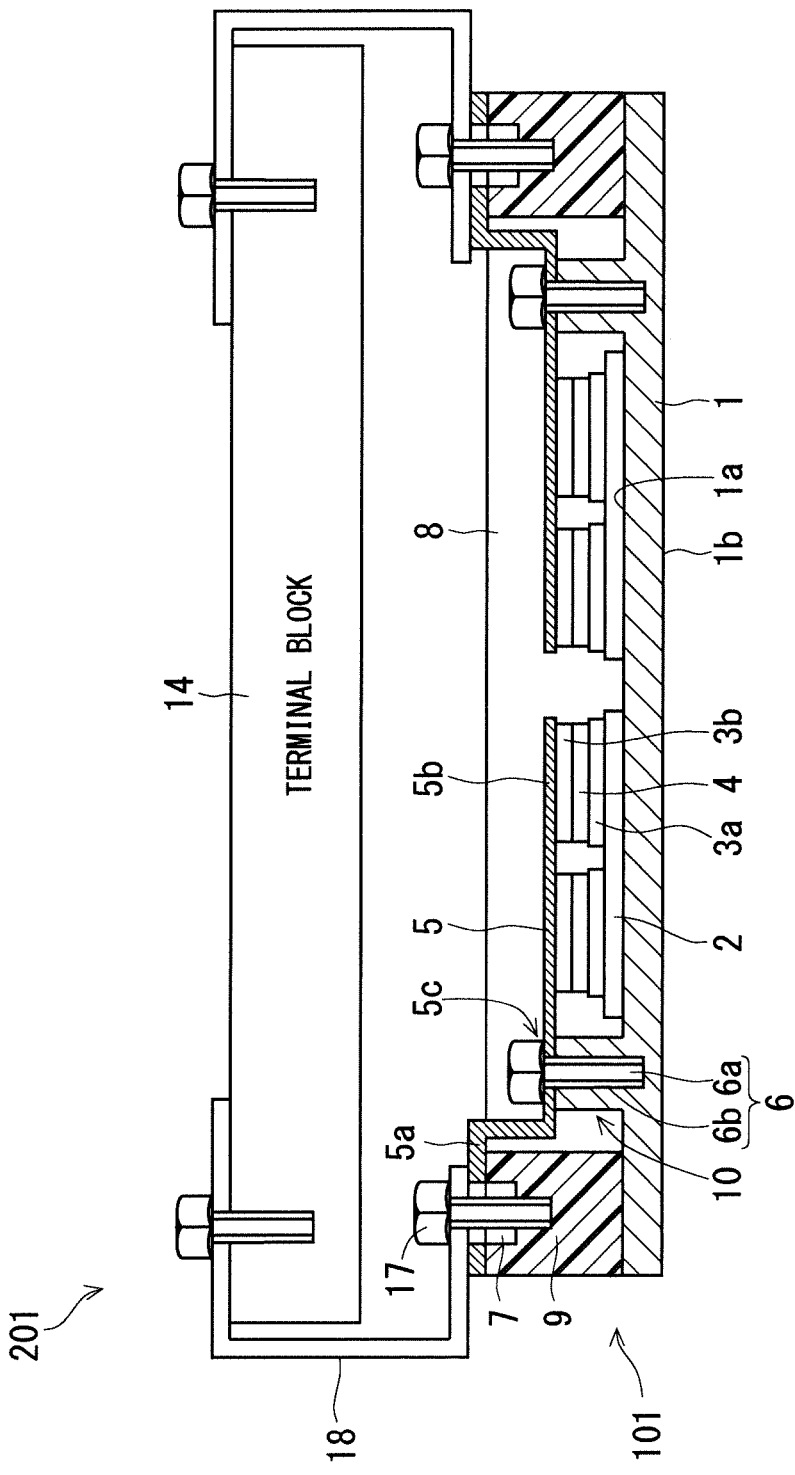
FIG. 10 is a diagram showing a control device according to a tenth embodiment.

A control device according to a tenth embodiment will be described. FIG. 10 is a diagram showing a control device 201 according to the tenth embodiment.

The control device 201 includes the semiconductor device 101 described in the first embodiment and a terminal block 14 capable of relaying connection between the semiconductor device 101 and an external device. The control device 201 may be provided, for example, in a train car. The one end 5a of the lead frame 5 of the semiconductor device 101 and the terminal block 14 are connected to the terminal section 7. That is, the one end 5a of the lead frame 5 is connected to the terminal block 14 via the terminal section 7. More specifically, the one end 5a of the lead frame is fastened to the nut of the terminal section 7 with a bolt 17 together with wiring 18 connecting the terminal block 14 and the semiconductor device 101.

In the control device 201 configured as described above, the fixing section 6 prevents external stress generated by vibration or thermal deformation of the terminal block 14 from being transmitted to the semiconductor element 4 through the terminal section 7 and the lead frame 5. The control device 201 prevents any defect such as a crack from occurring in the semiconductor element 4 or the bonding material 3b of the semiconductor device 101 due to the external stress. Accordingly, the control device 201 avoids any fatal failure occurring in the semiconductor element 4 of the semiconductor device 101. Note that the control device 201 exhibits the same effect even when the semiconductor device 101 is the semiconductor device described in any one of the second embodiment to the sixth embodiment.

Further, when the control device 201 includes the semiconductor device described in any one of the seventh embodiment to the ninth embodiment, instead of the semiconductor device 101, the control device 201 causes the bent section 11 or the curved section of the lead frame 5 to reduce or block the external stress generated by vibration or thermal deformation of the terminal block 14. Accordingly, the control device 201 avoids any fatal failure occurring in the semiconductor element 4.

Eleventh Embodiment

Figure 11:
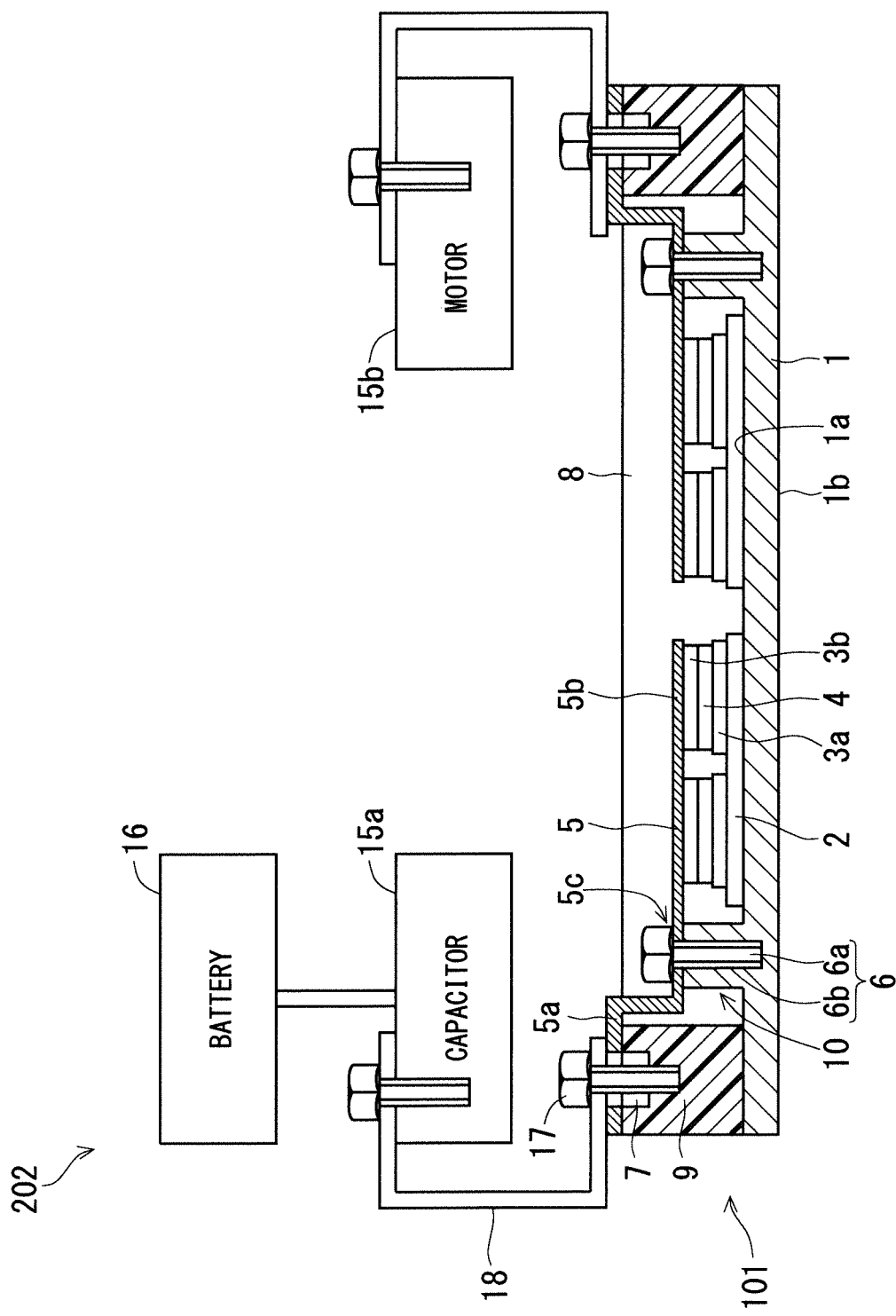
FIG. 11 is a diagram showing a control device according to an eleventh embodiment.

A control device according to an eleventh embodiment will be described. FIG. 11 is a diagram showing a control device 202 according to the eleventh embodiment.

The control device 202 includes the semiconductor device 101 described in the first embodiment and an external device. The external device is a capacitor 15a or a motor 15b. The control device 202 may be provided, for example, in an automobile powered by electricity. The one end 5a of the lead frame is fastened to the nut of the terminal section 7 with the bolt 17 together with wiring 18 connecting the capacitor 15a and the semiconductor device 101. Similarly, the one end 5a of the lead frame 5 is fastened to the nut of the terminal section 7 with a bolt together with wiring connecting the motor 15b and the semiconductor device 101. Further, the capacitor 15a is connected to a battery 16.

In the control device 202 configured as described above, the fixing section 6 prevents the external stress generated by vibration or thermal deformation of the external device from being transmitted to the semiconductor element 4 through the terminal section 7 and the lead frame 5. Accordingly, the control device 202 avoids any fatal failure occurring in the semiconductor element 4 of the semiconductor device 101. Note that the control device 202 exhibits the same effect even when the semiconductor device 101 is the semiconductor device described in any one of the second embodiment to the sixth embodiment.

Further, when the control device 202 includes the semiconductor device described in any one of the seventh embodiment to the ninth embodiment, instead of the semiconductor device 101, the control device 202 causes the bent section 11 or the curved section of the lead frame 5 to reduce or block the external stress generated by vibration or thermal deformation of the external device. Accordingly, the control device 202 avoids any fatal failure occurring in the semiconductor element 4.

Note that the present invention can be implemented by any combination of the embodiments within the scope of the present invention, and each of the embodiments can be modified or omitted as appropriate. Although the present invention has been described in detail, the above descriptions are illustrative in all aspects, and the present invention is not limited by the descriptions. It is understood that innumerable modifications not illustrated can be envisaged without departing from the scope of the present invention.

EXPLANATION OF REFERENCE SIGNS

1: base plate
1a: front surface of base plate
1b: back surface of base plate
2: insulation layer
3a: bonding material
3b: bonding material
4: semiconductor element
5: lead frame
5a: one end of lead frame
5b: other end of lead frame
5c: part of lead frame
6: fixing section
6a: screw
6b: threaded hole
6d: counterbore hole
6e: insert nut
6f: through hole
6g: first through hole
6h: second through hole
6i: fitting portion
7: terminal section
8: sealing material
9: housing
9a: front surface of stepped section
9b: back surface of stepped section
9c: outer surface
9d: upper surface
9e: stepped section
9f: housing body 10: protrusion
11: bent section
12a: groove section
12b: recessed section
13: fixing material
14: terminal block
15a: capacitor
15b: motor
101: semiconductor device
107: semiconductor device
201: control device
202: control device

The invention claimed is:

1. A semiconductor device comprising:
a base plate;
a semiconductor element held on the base plate;
a housing disposed on the base plate and having a frame shape enclosing the semiconductor element;
a terminal section provided in an outer surface of the housing and connectable to an external device;
a lead frame that is long and has one end disposed so as to be connectable to the terminal section provided in the housing and another end connected to the semiconductor element via a bonding material;
a sealing material disposed in the housing to seal the lead frame and the semiconductor element in the housing; and
a fixing section that is disposed on the base plate inside the housing and fixes part of the lead frame in the housing such that the part of the lead frame is held between the fixing section and a portion of the base plate, wherein
the part of the lead frame is fixed to a protrusion protruding from a front surface of the base plate.

2. The semiconductor device according to claim 1, wherein
the fixing section includes a threaded hole provided in the protrusion and a screw, and
the part of the lead frame is fixed to the protrusion by the screw that is screwed into the threaded hole.

3. The semiconductor device according to claim 2, wherein
the fixing section further includes a washer.

4. The semiconductor device according to claim 1, wherein
the fixing section includes a fitting portion provided on the protrusion, and
the part of the lead frame is fitted to the fitting portion and fixed to the protrusion.

5. A method for manufacturing the semiconductor device according to claim 1, the method comprising the steps of:
preparing the housing having the frame shape;
preparing the lead frame separately from the housing;
preparing the base plate and the semiconductor element held on the base plate;
disposing the housing on the base plate to cause the frame shape to enclose the semiconductor element;
disposing the one end of the lead frame so as to be connectable to the terminal section provided in the outer surface of the housing and bonding the other end of the lead frame onto the semiconductor element;
fixing the part of the lead frame to the fixing section in the housing; and
injecting the sealing material into the housing to seal the lead frame and the semiconductor element.

6. A semiconductor device comprising:
a base plate;
a semiconductor element held on the base plate;
a housing disposed on the base plate and having a frame shape enclosing the semiconductor element;
a terminal section provided in an outer surface of the housing and connectable to an external device;
a lead frame that is long and has one end disposed so as to be connectable to the terminal section provided in the housing and another end connected onto the semiconductor element via a bonding material;
a sealing material disposed in the housing to seal the lead frame and the semiconductor element in the housing, wherein
the lead frame includes a bent section or a curved section inside the housing, the bent section being part of the lead frame bent into a protruded shape or a recessed shape, the curved section being part of the lead frame curved into a convex shape or a concave shape,
the housing includes a housing body having the frame shape and a stepped section that is disposed inside the housing body and is lower in height than the housing body,
the stepped section includes a recessed accommodation portion that accommodates the bent section or the curved section, and
at least part of the bent section or the curved section of the lead frame is fixed in the recessed accommodation portion.

7. The semiconductor device according to claim 6, wherein
the at least part of the bent section or the curved section of the lead frame is fixed in contact with an inner wall of a groove section provided at the stepped section as the recessed accommodation portion.

8. The semiconductor device according to claim 6, wherein
the stepped section further includes a fixing material disposed in recessed section provided at the stepped section as the recessed accommodation portion to seal and fix the at least part of the bent section or the curved section.

9. The semiconductor device according to claim 6, wherein
the lead frame and the housing are not integrally formed.

10. A control device comprising:
the semiconductor device according to claim 6; and
a terminal block connected to the terminal section of the semiconductor device and capable of relaying connection between the semiconductor device and the external device, wherein
the one end of the lead frame of the semiconductor device is connected to the terminal block via the terminal section.

11. A control device comprising:
the semiconductor device according to claim 6; and
the external device, wherein
the one end of the lead frame of the semiconductor device and the external device are connected by the terminal section, and
the external device is a capacitor or a motor.

12. A method for manufacturing the semiconductor device according to claim 6, the method comprising the steps of:
preparing the housing having the frame shape;
preparing the lead frame separately from the housing;
preparing the base plate and the semiconductor element held on the base plate;
disposing the housing on the base plate to cause the frame shape to enclose the semiconductor element;

disposing the one end of the lead frame so as to be connectable to the terminal section provided in the outer surface of the housing and bonding the other end of the lead frame onto the semiconductor element; and injecting the sealing material into the housing to seal the lead frame and the semiconductor element, wherein preparing the lead frame includes a step of preparing the lead frame including a bent section or a curved section inside the housing, the bent section being part of the lead frame bent into a convex shape or a concave shape, the curved section being part of the lead frame curved into a convex shape or a concave shape.

13. A semiconductor device comprising:

a base plate;

a semiconductor element held on the base plate;

a housing disposed on the base plate and having a frame shape enclosing the semiconductor element;

a terminal section provided in an outer surface of the housing and connectable to an external device;

a lead frame that is long and has one end disposed so as to be connectable to the terminal section provided in the housing and another end connected to the semiconductor element via a bonding material;

a sealing material disposed in the housing to seal the lead frame and the semiconductor element in the housing; and a fixing section that fixes part of the lead frame in the housing, wherein the lead frame has a continuously flat surface from the other end of the lead frame which is in contact with the semiconductor element via the bonding material to the part of the lead frame which is fixed to the fixing section.

14. The semiconductor device according to claim 13, wherein the housing includes a housing body having the frame shape and a stepped section that is disposed inside the housing body and is lower in height than the housing body, and the fixing section is disposed in the stepped section.

15. The semiconductor device according to claim 14, wherein the fixing section includes a threaded hole provided in the stepped section and a screw, and the part of the lead frame is fixed to the stepped section by the screw that is screwed into the threaded hole.

16. The semiconductor device according to claim 15, wherein the fixing section further includes a washer.

17. The semiconductor device according to claim 14, wherein the fixing section includes a screw, a threaded hole, and a through hole, the through hole passes through from a front surface to a back surface of the stepped section, the threaded hole is provided in a front surface of the base plate in alignment with the through hole opening on the back surface of the stepped section, and the part of the lead frame is fixed by the screw that is screwed into the threaded hole via the through hole.

18. The semiconductor device according to claim 17, wherein the fixing section further includes a washer.

19. The semiconductor device according to claim 14, wherein the fixing section includes a screw, a threaded hole, a first through hole, and a second through hole, the first through hole passes through from a front surface to a back surface of the stepped section, the second through hole passes through from a front surface to a back surface of the base plate in alignment with the first through hole opening on the back surface of the stepped section, the threaded hole is provided through the part of the lead frame in alignment with the first through hole and the second through hole, and the part of the lead frame is fixed by the screw that has a head disposed on a side of the back surface of the base plate and is screwed into the threaded hole through the first through hole and the second through hole.

20. The semiconductor device according to claim 14, wherein the fixing section includes a fitting portion provided on the stepped section, and the part of the lead frame is fitted to the fitting portion and fixed to the stepped section.

21. The semiconductor device according to claim 13, wherein the lead frame and the housing are not integrally formed.

22. A control device comprising:

the semiconductor device according to claim 13; and a terminal block connected to the terminal section of the semiconductor device and capable of relaying connection between the semiconductor device and the external device, wherein the one end of the lead frame of the semiconductor device is connected to the terminal block via the terminal section.

23. A control device comprising:

the semiconductor device according to claim 13; and the external device, wherein the one end of the lead frame of the semiconductor device and the external device are connected by the terminal section, and the external device is a capacitor or a motor.

* * * * *